US009310687B2

(12) United States Patent
Maneira

(10) Patent No.: US 9,310,687 B2
(45) Date of Patent: *Apr. 12, 2016

(54) PHOTOPOLYMER IMAGING FROM SOLVENT INK FILM IMAGES

(71) Applicant: Chemence, Inc., Alpharetta, GA (US)

(72) Inventor: John P. Maneira, Alpharetta, GA (US)

(73) Assignee: Chemence, Inc., Alpharetta, GA (US)

( * ) Notice: Subject to any disclaimer, the term of this patent is extended or adjusted under 35 U.S.C. 154(b) by 47 days.

This patent is subject to a terminal disclaimer.

(21) Appl. No.: 14/176,110

(22) Filed: Feb. 9, 2014

(65) Prior Publication Data

US 2014/0162192 A1 Jun. 12, 2014

Related U.S. Application Data

(63) Continuation-in-part of application No. 14/027,760, filed on Sep. 16, 2013, which is a continuation-in-part of application No. 13/618,507, filed on Sep. 14, 2012, which is a continuation-in-part of application No. 12/895,561, filed on Sep. 30, 2010.

(51) Int. Cl.
*B41N 1/12* (2006.01)
*G03F 7/20* (2006.01)

(52) U.S. Cl.
CPC ............ *G03F 7/2032* (2013.01); *G03F 7/2018* (2013.01)

(58) Field of Classification Search
CPC ........ G03F 1/68; G03F 7/2018; G03F 7/2032
USPC .......................................... 428/32.1; 430/306
See application file for complete search history.

(56) References Cited

U.S. PATENT DOCUMENTS

| 2003/0041962 A1* | 3/2003 | Johnson et al. ................ 156/266 |
| 2003/0134138 A1* | 7/2003 | Kreckel et al. ............. 428/542.2 |
| 2006/0084008 A1* | 4/2006 | Long et al. ..................... 430/302 |
| 2006/0198960 A1* | 9/2006 | Calvert et al. ................. 427/282 |
| 2007/0215271 A1* | 9/2007 | McClintic ..................... 156/247 |
| 2008/0050548 A1* | 2/2008 | Abrams ........................ 428/41.8 |
| 2011/0189477 A1* | 8/2011 | Miracle et al. ................ 428/349 |

* cited by examiner

*Primary Examiner* — Chanceity Robinson
(74) *Attorney, Agent, or Firm* — Jonathan R. Smith; Jonathan Rigdon Smith, J.D., PC

(57) ABSTRACT

Negatives, and laminates containing negatives, for exposing liquid photopolymers in UV flexographic plate making are created by printing opaque images directly onto the protective or release cover films used in plate making processes. Combining negatives and cover films in this way eliminates two layers and two interfaces in the exposure process, reducing cost and improving quality. By bringing the negative images as close as possible to the liquid photopolymer, printed dots of "digital quality" are created.

3 Claims, 5 Drawing Sheets

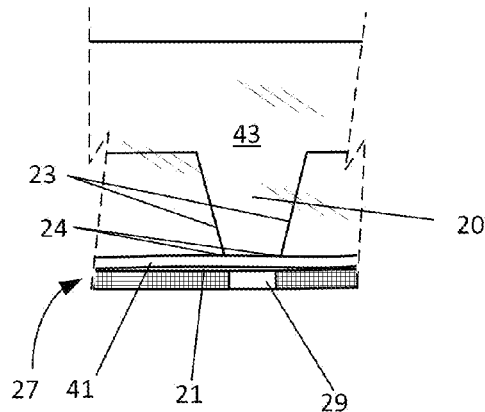
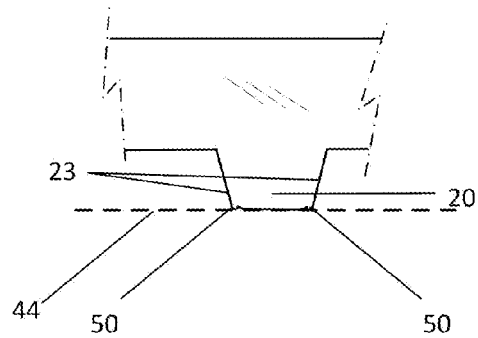
FIG. 3
PRIOR ART
FIG. 4
PRIOR ART
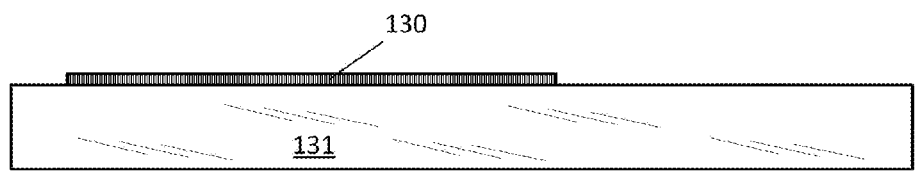
FIG. 5
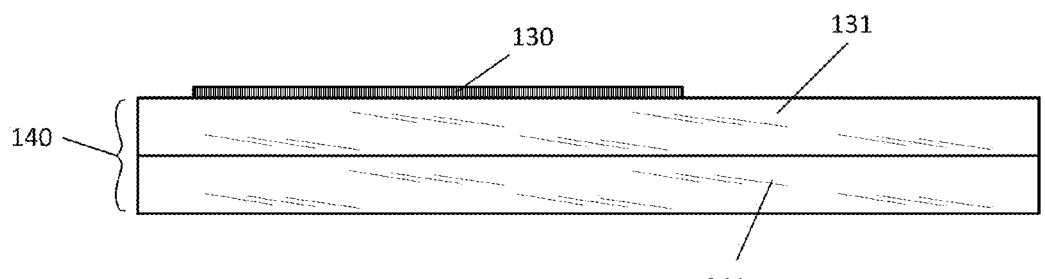
FIG. 6

PHOTOPOLYMER IMAGING FROM SOLVENT INK FILM IMAGES

CROSS-REFERENCES TO RELATED APPLICATIONS

This application is a Continuation-In-Part of U.S. patent application Ser. No. 14/027,760 filed Sep. 16, 2013, which is a Continuation-In-Part of U.S. patent application Ser. No. 13/618,507 filed Sep. 14, 2012, and which in turn is a Continuation-In-Part of U.S. patent application Ser. No. 12/895,561 filed Sep. 30, 2010, claims priority thereto, and incorporates these into the instant application in their entirety. A related patent application is U.S. patent application Ser. No. 13/902,301 filed Feb. 19, 2013. These applications are owned in common and have at least one inventor in common, and are incorporated into the instant application in their entirety.

STATEMENT REGARDING FEDERALLY SPONSORED RESEARCH OR DEVELOPMENT

Not applicable.

NAMES OF THE PARTIES TO A JOINT RESEARCH AGREEMENT

Not applicable.

REFERENCE TO A BIOLOGICAL SEQUENCE LISTING

Not applicable.

BACKGROUND OF INVENTION

1. Field of the Invention

This invention is in the field of printing, more specifically in the field of making flexographic printing plates with digital quality flat top dots using liquid photopolymers, and still more specifically in the field of using solvent-based inks to print the flexographic plate negatives.

2. Description of the Related Art

A prior art method of preparation of a simple flexographic ("flexo") printing plate from cast liquid photopolymer currently involves the steps of (a) printing a black negative image on a white substrate; (b) photographing the negative image; (c) developing the film negative; (d) positioning the film negative on the bottom glass of a UV exposure unit; (e) positioning liquid dams and taping the negative in place with masking tape as necessary; (f) placing a thin plastic vacuum sheet (cover film) over the negative; (g) casting liquid photopolymer over the film to the proper depth; (h) applying a vacuum to the laminate thus formed (negative, vacuum sheet, and photopolymer); (i) exposing this laminate to UV (or other appropriate actinic) radiation through the negative for an amount of time sufficient to create a cross-linked polymerized image in the photopolymer; (j) removing the laminate from the unit and separating the vacuum sheet and negative from the cross-linked photopolymer; and (k) removing the unexposed material to develop a relief image.

The vacuum step (h) is important. If there are any pockets of air between the negative and the adjacent surface of the photopolymer, the UV light will be refracted by the interfaces between the film, the air, and the photopolymer and the final image after exposure will be distorted. If the pockets of air are large enough, they can even lead to mechanical failure of the plate by creating thin spots in the photopolymer. Moreover, ambient oxygen in any air pockets in contact with surface of the photopolymer inhibits full curing of the photopolymer all the way to the photopolymer surface. (This is thought to be because oxygen in the air reacts with gases formed within the photopolymer layer during UV curing, the products of which slow the curing rate.) Provided the negative and vacuum sheet are skillfully placed, the vacuum system in the special exposure unit will remove a great majority (but not all) such pockets of air. The tops of the half tone dots produced with distortion due to the presence of air are rounded; the printed images of such dots oftentimes appear as tiny squiggles where the dots should be. Even with perfect alignment and application of vacuum, single halftone or pixel dots produced this way suffer from being separated from the photopolymer by the additional thickness of a cover sheet. They do not have steep shoulders and cause dot gain when printed.

BRIEF DESCRIPTION OF THE INVENTION

The laminates and methods of the present invention relate to printing, namely creating fine detail inkjet images that can be placed in direct contact with the surfaces of cast liquid photopolymer to produce flexo plates with "digital quality" flat top dots, that is, single pixel dots having a shape like that produced by IR ablation of digital photopolymer sheets. The methods further reduce the aforementioned problems with gas bubbles, eliminate layers of material, eliminate the need for expensive e.g. microporous ink-receptive coatings, reduce the number of steps required and the level of expertise necessary to execute them, and produce final prints of higher quality than achievable by current methods under the best of conditions.

Not only do dots created using the laminates and methods of the present invention produce a better image, it has also been determined that flexo plates with such digital quality dots last longer (endure more impressions) than prior art liquid dots because they distribute the impact stress more evenly throughout the polymer. All of the above steps except perhaps (c), (h) and (i) require human handling and make the entire process slow, another reason for combining or eliminating some of these steps.

Until the applicant's invention described in U.S. patent application Ser. No. 13/902,301 filed Feb. 19, 2013, it was not possible to create images for flexo plate making from solvent-based inks that were sufficiently opaque to UV radiation. Only applicant's U.S. patent application Ser. No. 14/027,760 filed Sep. 16, 2013, describes and claims laminates to produce digital quality flat top dots using liquid photopolymers and solvent-based inkjet inks. This Continuation-In-Part of that application describes and claims other aspects of the same methods and laminates involving liquid photopolymers.

The first embodiment of the present invention provides for a relief negative image to be printed with solvent-based ink onto a vinyl-based film. This film is placed on the lower glass of an exposure unit, preferably image side up, and liquid photopolymer is cast over it. The second embodiment provides for a solvent ink negative image to be printed on a cover film made of a layer of solvent ink receptive material superimposed on a layer of adhesive-releasing material. In the third embodiment, the solvent ink printable surface may be on a backing laminate consisting of a flexographic plate backing sheet made of, or coated with, polyvinyl-based material on its upper surface, with a tie-coat applied to the lower surface. The fourth embodiment is a backing laminate consisting of the laminate of U.S. patent application Ser. No. 14/027,760 printed with solvent-based ink and applied to the upper surface of a layer of liquid photopolymer.

BRIEF DESCRIPTION OF THE DRAWINGS

FIG. 3 is a highly magnified cross-sectional illustration of a single halftone or pixel dot produced by the prior art methods.

FIG. 4 is a highly magnified cross-sectional illustration of the prior art dot during printing.

FIG. 5 is a cross-sectional illustration of a solvent ink negative printed on a protective cover film in accordance with the first embodiment of the present invention.

FIG. 6 is a cross-sectional illustration of a solvent ink negative printed on a laminate in accordance with the second embodiment of the present invention.

(The third embodiment is not illustrated.)

Figure 7:
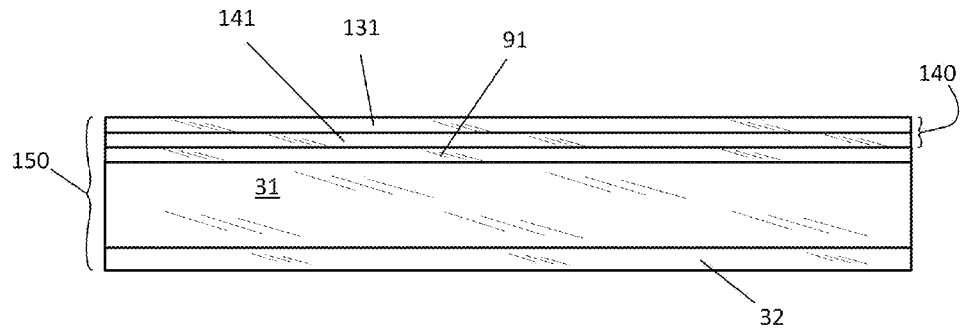

FIG. 7 is a cross-sectional illustration of the present invention, namely the Jetsetter Genesys™ backing laminate of U.S. patent application Ser. No. 14/027,760, in accordance with the fourth embodiment of the present invention.

Figure 8:
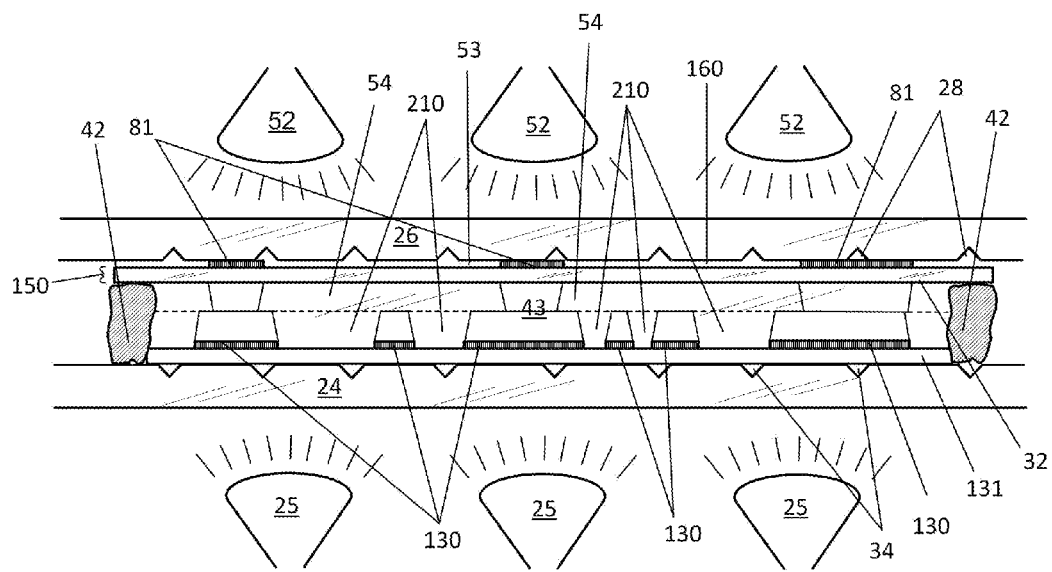

FIG. 8 is a cross-sectional illustration of the method for using the Jetsetter Genesys™ backing laminate for making a flexographic I-plate in accordance with the present invention.

Figure 9:
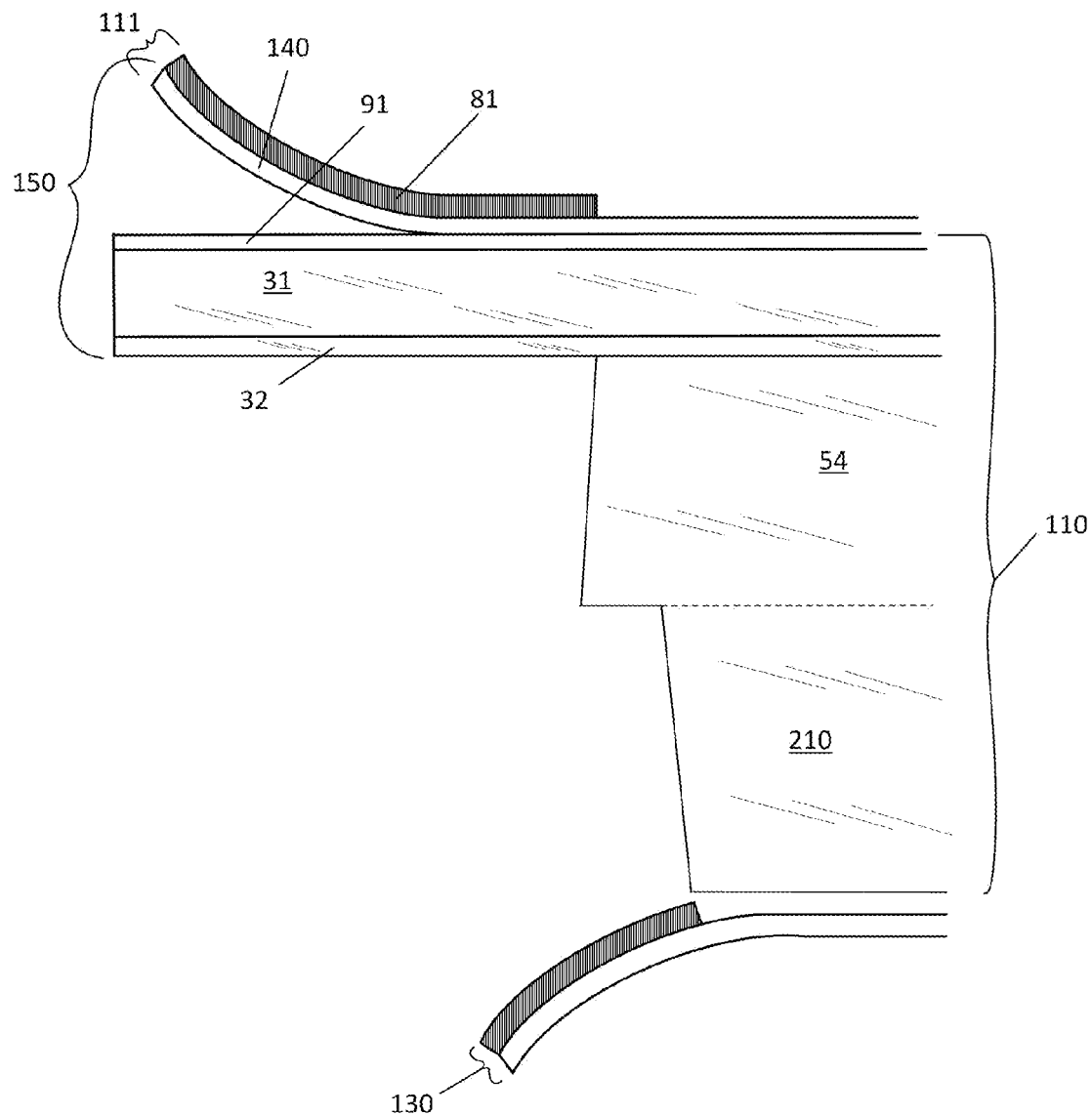

FIG. 9 is a cross-sectional illustration showing removal of the printed cover film and release liner from the finished Jetsetter Genesys™ flexographic printing plate made using the fourth embodiment of the present invention.

Figure 10:
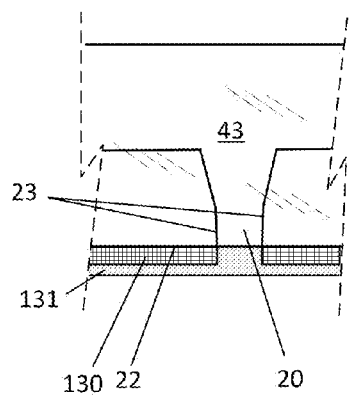

FIG. 10 is a highly magnified cross-sectional illustration of a single halftone or pixel dot produced by casting liquid photopolymer over the first embodiment printed cover film.

Figure 11:
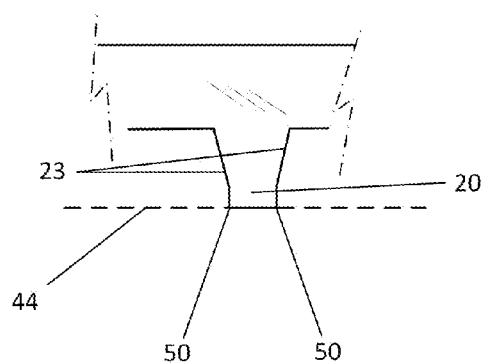

FIG. 11 is a highly magnified cross-sectional illustration of a single halftone or pixel dot produced by the first embodiment during printing.

DETAILED DESCRIPTION OF THE INVENTION

Figure 1:
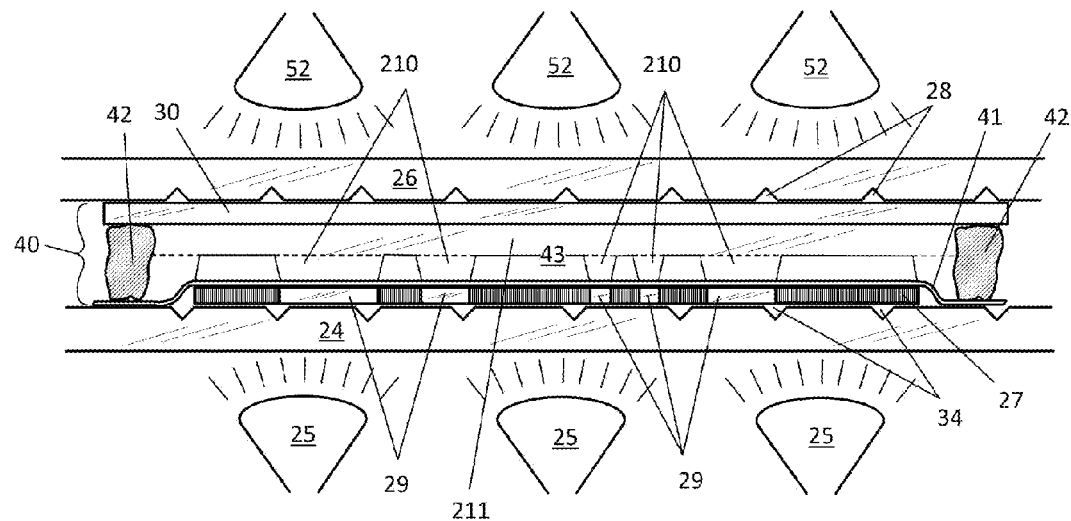
FIG. 1 is a cross-sectional illustration of a prior art method of using a liquid photopolymer polymer to make a flexographic plate.

Referring now to the drawings, which are not to scale, and in which like reference characters refer to like elements among the drawings, FIG. 1 is a magnified cross-sectional illustration of a prior art method of using a liquid photopolymer to make a flexographic plate. An arrangement of plate-making layers 40 is assembled to make a traditional flexographic plate using a liquid photopolymer where a prior art substrate 30 is laminated to the cast liquid. The steps to accomplish this are:

(a) Place the image negative 27 on the bottom glass 24;

(b) Cover (protect) the negative 27 with a clear cover film 41;

(c) Turn on a vacuum source (not shown) connected to the lower vacuum grooves 34 to remove air from between the bottom glass 24, the image negative 27, and the clear cover film 41;

(d) Depending on the viscosity of the liquid photopolymer, nonporous damming material 42 may have to be placed around all sides of the negative 27 to control flow of liquid photopolymer over the negative by creating a shallow basin on the negative; (Dams are optional and not used in all instances. The liquid photopolymer is very viscous and does not readily flow after lamination in the process.)

(e) Pour or cast liquid photopolymer 43 over the cover film 41 (within the dams 42 if applicable);

(f) Apply a polyester substrate 30 over the liquid photopolymer 43 with the tie-coat side down (tie-coat not visible in this view);

(g) Lower the top glass 26 over the entire plate-making arrangement 40;

(h) Turn on a vacuum source (not shown) connected to the upper vacuum grooves 28 to remove air from between the substrate 30 and the upper glass 26;

(i) Turn on the upper UV lights 52 for a prescribed amount of time to shine through the upper glass 26, causing a uniform floor layer 211 to form in the photopolymer layer 43 below the substrate 30;

(j) Close the shutter (not shown) to prevent light reflection from the upper glass during the image exposure step;

(k) Turn on the lower UV lights 25 to shine through the clear areas 29 in the negative 27, causing vertical regions 210 in the liquid photopolymer 43 above the clear areas 29 to polymerize; and (l) Remove the plate-making arrangement 40 from the unit for further processing to create the relief image, namely, by turning the plate-making arrangement over, removing the cover film 41 and dams 42, and draining/collecting the un-polymerized liquid photopolymer for recycle and reuse.

Figure 2:
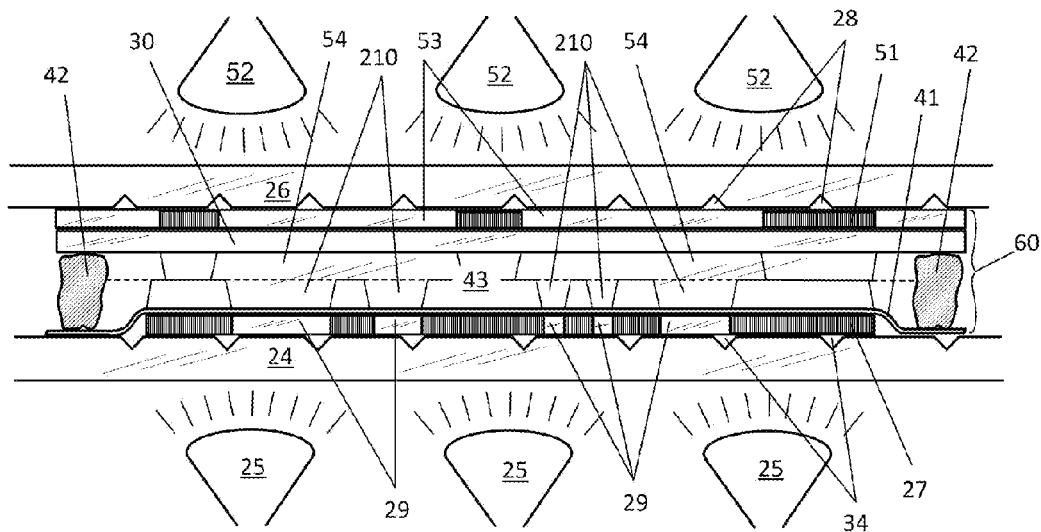
FIG. 2 is a cross-sectional illustration of a prior art method of using a liquid photopolymer to make a flexographic I-plate.

FIG. 2 is a magnified cross-sectional illustration of a prior art method of using a liquid photopolymer to make a flexographic I-plate. A prior art plate-making arrangement 60 is assembled to make a flexographic I-plate using a liquid photopolymer where the polyester substrate 30 is laminated to the cast liquid. The steps involved are:

(a) Place the relief image negative 27 on the bottom glass 24;

(b) Cover (protect) the negative with a clear cover film 41;

(c) Turn on a vacuum source (not shown) connected to the lower vacuum grooves 34 to remove air from between the bottom glass 24, the image negative 27, and the clear cover film 41;

(d) Depending on the viscosity of the liquid photopolymer, nonporous damming material 42 may have to be placed around all sides of the negative 27 to control flow of liquid photopolymer over the negative by creating a shallow basin on the negative;

(e) Pour or cast liquid photopolymer 43 over the cover film 41 (within the dams 42 if applicable);

(f) Apply a polyester substrate 30 over the liquid photopolymer 43 with the tie-coat side down (tie-coat not visible in this view);

(g) Place the masking film 51 on top of the polyester substrate 30 and register it so that the clear areas 53 on the masking film 51 properly surround the clear areas 29 on the image negative 27 below;

(h) Lower the top glass 26 over the entire plate-making arrangement 60;

(i) Turn on a vacuum source (not shown) connected to the vacuum grooves 28 to remove air from between the upper glass 26, the masking film 51, and the substrate 30;

(j) Turn on the upper UV lights 52 to shine through the clear areas 53 in the masking negative 51 for a limited time, causing vertical regions 54 in the liquid photopolymer below the clear areas 53, adjacent to the polyester substrate 30, to polymerize a portion of the liquid photopolymer layer 43 to form island floor areas;

(k) Close the shutter (not shown) to prevent light reflection from the upper glass during the image exposure step;

(l) Turn on the lower UV lights 25 to shine through the clear areas 29 in the relief image negative 27, causing vertical regions 210 in the un-polymerized liquid photopolymer above the clear areas 29 (and below the vertical regions 54) to polymerize an additional amount of the liquid photopolymer layer 43 to form the relief image; and (m) Remove the plate-making arrangement 60 from the unit for further processing to uncover the relief image, namely, by turning the plate-making arrangement over, removing the cover film 41 and dams 42, and draining/collecting the un-polymerized liquid photopolymer for recycle and reuse.

Note that this plate-making arrangement 60 puts an image-quality-reducing boundary between the masking film 51 and the polyester substrate 30 which must also be evacuated by the vacuum grooves 28. Regardless of how well the vacuum works, it is not perfect, and the masking film 51 is displaced away from the liquid photopolymer layer 43 by the thickness of the polyester substrate 30. (The boundaries between the liquid photopolymer layer 43 and the polyester substrate 30 above it and the cover film 41 below it are substantially free of air because they cover the free surfaces of the liquid.)

FIG. 3 is a more highly magnified cross-sectional view of a portion of a liquid photopolymer layer 43 exposed and developed as described in FIG. 1 or 2 under a good vacuum as taught in the prior art. It shows a single relief dot 20 formed above a one-pixel-wide transparent area 29 in the film negative 27. Even under good vacuum there will be pockets of gas 21 (predominantly air) beneath the cover film 41. These variable gaps, in addition to the thickness of the cover film 41, cause the shoulders 23 of the dot to be about 35° off the vertical. When this dot is printed, the edges 50 of the dot 20 become distorted as shown in FIG. 4.

FIG. 4 is a highly magnified view of the same dot 20 as it impacts a sheet of paper 44. As the dot 20 is squeezed upward by the print pressure, the dot edges 50 are crushed against the paper 44, increasing the diameter of the printed dot ("dot gain") and roughening its edges (reducing its sharpness).

FIG. 5 is a cross-sectional illustration of a first embodiment of the present invention, namely a solvent ink negative image 130 printed on an image sheet 131 made entirely of solvent ink receptive material. The solvent inks made in accordance with U.S. patent application Ser. No. 13/902,301 are satisfactorily printed on cover film material comprising polyvinyl-based polymers, particularly polyvinylethylene. This embodiment may be used on the bottom glass of a UV exposure unit in place of a relief image negative covered by a protective cover film, with or without the Jetsetter Genesys™ backing laminate described further below. Using this embodiment, the entire relief image negative 27 of the prior art is eliminated, along with the air-containing interface 21 between the negative and the cover film 41 of the prior art (see FIG. 3). The scope of this invention includes, by way of example and not limitation, mixtures or copolymers containing both polyvinyls and polyethylenes, which would be both solvent ink compatible and adhesive releasing, and polyvinyls and polyesters, which would be both solvent ink compatible and adhesive retaining.

In this description of the invention, inkjet printers are mentioned because they have been used by the inventor to generate the desired high-definition images with solvent-based inks. However, any printer capable of printing solvent-based inks is within the scope of this invention without limitation.

FIG. 6 is a cross-sectional illustration of a second embodiment image sheet of the present invention, namely a solvent ink negative image 130 printed on a protective cover film 140 made of a layer of solvent ink receptive material 131 superimposed on a layer of adhesive-releasing material 141. As in the first embodiment described in FIG. 13, the solvent inks made in accordance with U.S. patent application Ser. No. 13/902,301 are satisfactorily printed on cover sheet material comprising polyvinyl-based polymers, particularly polyvinylethylene. The layer of adhesive releasing material 141 may be comprised of a variety of polymer-based films such as polyethylene. The layer of adhesive releasing material 141 allows this embodiment to be used in place of the combination of a masking negative and release liner on top of the backing sheet, and is distinct in this regard from the first embodiment. This cover film/release liner image sheet may be thicker than the cover film used in the first embodiment.

Alternatively, as a third embodiment of the present invention (not drawn) the layer of adhesive-releasing material may be a backing laminate consisting of a flexographic plate backing sheet made from a solvent ink compatible polymer, with a tie-coat applied to the bottom surface. This would allow a solvent ink image to be printed directly onto the backing sheet to be used in the manner of the backing sheet taught and claimed in the aforementioned U.S. patent application Ser. No. 12/895,561.

FIG. 7 is a cross-sectional illustration of the fourth embodiment of the present invention. It is a backing laminate called the Jetsetter Genesys™ backing laminate 150, ready for solvent-based ink printing. The unprinted two-layer image sheet 140 of FIG. 6 has been placed against the adhesive coating 91 on a polyester backing sheet 31. A solvent-based image can now be printed on the solvent ink receptive layer 131.

FIG. 8 is a cross-sectional illustration of the method for using the Jetsetter Genesys™ backing laminate of the fourth embodiment together with a relief negative of the first embodiment in making a flexographic I-plate in accordance with the present invention. Steps for preparing an I-plate from liquid photopolymer starting with these two laminates are as follows:

(a) Print the digital representation of the island image 81 on the solvent ink receptive side of the Jetsetter Genesys™ backing laminate 150 (see FIG. 7) using a suitable inkjet printer;

(b) Print the digital representation of the relief image 130 onto the solvent ink receptive image sheet 131 (see FIG. 5);

(c) Place the image sheet 131 with the relief image 130 on the bottom glass 24 of the UV exposure unit (preferably, but not essentially, with the image side facing up);

(d) Preferably but optionally, turn on a vacuum source (not shown) connected to the lower vacuum grooves 34 to remove air from between the bottom glass 24, the image negative 27, and the clear cover film 41;

(e) Cast a layer of liquid photopolymer 43 adjacent to the relief image sheet 131 (employing dams 42 if necessary);

(f) Place the tie-coat 32 of the Jetsetter Genesys™ backing laminate 150 in contact with the upper surface of the liquid photopolymer layer 43 (registering the island image properly with respect to the relief image negative) creating an exposure laminate consisting of, from the bottom up, sheet 131, photopolymer layer 43, and backing laminate 150;

(g) Lower the top glass 26 onto the laminate 150;

(h) Preferably but optionally, turn on a vacuum source (not shown) connected to the upper vacuum grooves 28 to remove air from between the substrate 30 and the upper glass 26;

(i) Shine polymerizing light 52 through the Jetsetter Genesys™ backing laminate 150 for an amount of time suitable to form polymerized island floor areas 54 of a desired thickness in the liquid photopolymer in contact with the tie-coat 32;

(j) Shine polymerizing light 25 through the relief image 130 for an amount of time suitable to form a polymerized relief image 210 in the liquid photopolymer between the polymerized island floor areas 54 and the relief image sheet 131; and (k) Remove the exposure laminate from the unit for further processing to develop the relief image, namely, by turning the exposure laminate over and draining/collecting the un-polymerized liquid photopolymer for recycle and reuse.

Image quality using these laminates is high because, especially with the relief ink image facing up as shown in FIG. 8, both ink-bearing films are in intimate contact with both the upper and lower surfaces of the photopolymer layer. The upper (Jetsetter Genesys™) laminate rests directly on the photopolymer layer, and the liquid photopolymer flows directly onto the image surface of the inked surface of the lower cover film. (The space 160 in FIG. 8 is a drawing artifact due to the exaggerated vertical dimension of the drawing.)

FIG. 9 is a cross-sectional illustration showing removal of the printed cover film and release liner from the finished flexographic printing plate produced using the fourth embodiment Jetsetter Genesys™. After exposure is complete, the lower printed cover film 130 is peeled off of the relief image 210 and discarded. The upper printed release liner 111 is peeled off of the Jetsetter Genesys™ laminate 150 and discarded or reused. The polymerized island and relief images 54 and 210 respectively are cleaned and cured, leaving the finished flexographic printing plate 110 with the adhesive layer 91 exposed.

The present invention also includes performing the above method with the alteration of substituting, in step e., for the fourth embodiment backing laminate 150, solely a polyvinyl-based backing sheet (or other liquid photopolymer-compatible backing sheet) and tie coat, to produce a relief image only (method not illustrated).

The present invention further includes performing the above method with the alteration of substituting, in step (f), for backing laminate 150, the two-layer laminate of FIG. 6 with layer 141 being a polyester backing sheet with a tie-coat applied to the bottom surface (method not illustrated).

FIG. 10 is a highly magnified view of a relief dot 20 produced using the first laminate of the invention as shown in FIG. 5 and prepared in accordance with the above method of the invention. The cover sheet 131 printed with solvent ink image 130 takes the place of the prior art negative 27 (see FIGS. 1 and 2) and places the image 130 directly against the bottom surface 22 of the liquid photopolymer layer 43. The UV radiation spreads out much less as it enters the photopolymer than it does in the prior art (depicted in FIG. 3). This causes the shoulders 23 of the dot to be extended and substantially vertical. When this dot is printed, the shoulders 23 accommodate print pressure as shown in FIG. 11.

FIG. 11 is a highly magnified view of the dot 20 of FIG. 10 as it impacts a sheet of paper 44. As the dot 20 is squeezed upward by the print pressure, the dot edges 50 retain their diameter and roundness.

The invention claimed is:

1. A backing laminate for producing an image in a liquid photopolymer, comprising:
   a flexible backing sheet with a liquid photopolymer-binding tie-coat on one side of the flexible backing sheet and an adhesive coating on the other side of the backing sheet;
   a liquid photopolymer layer applied to the photopolymer-binding tie coat, exposed to actinic radiation, and processed to produce a relief image; and
   a release liner having one side of the release liner placed against the adhesive coating and the other side of the release liner having a solvent ink receptive surface.

2. The backing laminate of claim 1, in which:
   said solvent ink receptive surface comprises polyvinyl-based material.

3. The backing laminate of claim 2, in which:
   said polyvinyl-based material comprises polyvinylethylene.

* * * * *